United States Patent
Kumar et al.

(10) Patent No.: US 12,399,219 B1
(45) Date of Patent: Aug. 26, 2025

(54) CONSTRAINED RANDOM SIMULATION USING MACHINE LEARNING AND BAYESIAN ESTIMATION

(71) Applicant: Synopsys, Inc., Sunnyvale, CA (US)

(72) Inventors: Bhuvnesh Kumar, San Jose, CA (US); Ganapathy Parthasarathy, Fremont, CA (US); Saurav Nanda, San Jose, CA (US); Sridhar Rajakumar, Fremont, CA (US)

(73) Assignee: Synopsys, Inc., Sunnyvale, CA (US)

( * ) Notice: Subject to any disclaimer, the term of this patent is extended or adjusted under 35 U.S.C. 154(b) by 62 days.

(21) Appl. No.: 18/235,738

(22) Filed: Aug. 18, 2023

(51) Int. Cl.
| | | |
|---|---|---|
| *G01R 31/317* | (2006.01) | |
| *G01R 31/3177* | (2006.01) | |
| *G01R 31/3183* | (2006.01) | |
| *G01R 31/3185* | (2006.01) | |
| *G06F 11/26* | (2006.01) | |
| *G06F 11/267* | (2006.01) | |
| *G06F 11/27* | (2006.01) | |
| *G06F 11/34* | (2006.01) | |
| *G06N 7/01* | (2023.01) | |

(52) U.S. Cl.
CPC ....... *G01R 31/318357* (2013.01); *G06N 7/01* (2023.01)

(58) Field of Classification Search
CPC .......................... G06N 7/01; G01R 31/318357
See application file for complete search history.

(56) References Cited

U.S. PATENT DOCUMENTS

| | | | | |
|---|---|---|---|---|
| 8,656,339 | B2 * | 2/2014 | Gillespie | G06F 30/367 716/136 |
| 9,053,259 | B1 * | 6/2015 | Gennari | G06F 30/398 |
| 2006/0066339 | A1 * | 3/2006 | Rajski | G01R 31/2846 324/762.02 |
| 2008/0249743 | A1 * | 10/2008 | Hirohata | G01R 31/2803 702/186 |
| 2011/0088008 | A1 * | 4/2011 | Fifield | G06F 30/327 714/763 |
| 2018/0172753 | A1 * | 6/2018 | Deshpande | H03K 5/159 |

OTHER PUBLICATIONS

Monica Farkash, et al. "Mining Coverage Data for Test Set Coverage Efficiency" Design and Verification Conference, DVCON 2015, Santa Clara, CA, USA. 2015.
Ganapathy Parthasarathy, et al. "RTL Regression Test Selection using Machine Learning" 2022 27th Asia and South Pacific Design Automation Conference (ASP-DAC) | 978-1-6654-2135-5/22/$31.00 Â © 2022 IEEE | DOI: 10.1109/ASP-DAC52403.2022.9712550.
Ganapathy Parthasaranthy et al., "Test Selection and Prioritization Using Machine Learning " U.S. Appl. No. 17/168,674, filed Feb. 2021.
J. V. Uspensky. Introduction to Mathematical Probability, p. 45. McGraw-Hill Book Co., Inc., 1937.

* cited by examiner

*Primary Examiner* — Esaw T Abraham
(74) *Attorney, Agent, or Firm* — Patterson + Sheridan, LLP (57) ABSTRACT

Certain aspects of the present disclosure are directed towards a method for circuit testing. The method generally includes: determining a probability distribution indicating prior failure probabilities associated with a circuit design; determining a first likelihood associated with occurrence of at least one failure for the circuit design; determining a quantity of test instances to be performed using simulation to detect the at least one failure based on the probability distribution and the first likelihood; and outputting the quantity of test instances.

20 Claims, 6 Drawing Sheets

CONSTRAINED RANDOM SIMULATION USING MACHINE LEARNING AND BAYESIAN ESTIMATION

TECHNICAL FIELD

The present disclosure generally relates to an electronic design automation (EDA) system, and more particularly, to performing constrained random simulations of circuit designs.

BACKGROUND

Constrained Random Verification (CRV) is a technique used for verification of circuit designs. CRV may be used to validate functionality of systems by generating test cases in a random or pseudo-random manner. By simulating a wide range of scenarios, CRV allows designers to efficiently uncover failures in a circuit design. Performing verification by manually creating test cases to cover specific scenarios is time-consuming and prone to errors. CRV automates the generation of test cases using randomization and constraints. For example, properties and constraints (e.g., operating boundaries) of the system under verification may be identified. For example, constraints may include specific input ranges or specific sequences of events. A typical CRV methodology uses randomization to generate test cases that satisfy the constraints, enabling functional verification without exhaustive testing of the system.

SUMMARY

The following presents a simplified summary of one or more aspects of the present disclosure, in order to provide a basic understanding of such aspects. This summary is not an extensive overview of all contemplated features of the disclosure, and is intended neither to identify key or critical elements of all aspects of the disclosure nor to delineate the scope of any or all aspects of the disclosure. Its sole purpose is to present some concepts of one or more aspects of the disclosure in a simplified form as a prelude to the more detailed description that is presented later.

Certain aspects of the present disclosure are directed towards a method for circuit testing. The method generally includes: determining a probability distribution indicating prior failure probabilities associated with a circuit design; determining a first likelihood associated with occurrence of at least one failure for the circuit design; determining a quantity of test instances to be performed using simulation to detect the at least one failure based on the probability distribution and the first likelihood; and outputting the quantity of test instances.

Certain aspects of the present disclosure are directed towards an apparatus for circuit testing. The apparatus generally includes a memory and one or more processors coupled to the memory and configured to: determine a probability distribution indicating prior failure probabilities associated with a circuit design; determine a first likelihood associated with occurrence of at least one failure for the circuit design; determine a quantity of test instances to be performed using simulation to detect the at least one failure based on the probability distribution and the first likelihood; and output the quantity of test instances.

Certain aspects of the present disclosure are directed towards a non-transitory computer-readable medium having instructions stored thereon, that when executed by one or more processors, cause the one or more processors to: determining a probability distribution indicating prior failure probabilities associated with a circuit design; determining a first likelihood associated with occurrence of at least one failure for the circuit design; determining a number of test instances to be performed using simulation to detect the at least one failure based on the probability distribution and the first likelihood; and outputting the number of test instances.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

DETAILED DESCRIPTION

Certain aspects of the present disclosure are directed towards an estimator configured to estimate a number of test instances to be performed to test for a failure using Bayesian estimation. In some aspects, a prior probability (e.g., historical probability) of the occurrence of the failure may be determined. In some aspects, the prior probability (e.g., probability score) may be determined using a machine learning model, also referred to herein as an intelligent test selection (ITS) model or classifier. Based on the prior probability generated by the ITS classifier, the estimator may determine a prior probability distribution (referred to herein as the "prior"). In some aspects, a likelihood of the failure may be determined. In some implementations, the likelihood may be determined using regression data (e.g., also referred to herein as ground truth), if available. The regression data may be simulation data indicating the probability of the failure. If the regression data is not available, the likelihood may be determined based on the prior probability (e.g., from the ITS classifier) and using a Binomial distribution, as described in more detail herein. Based on the prior and the likelihood, a posterior probability distribution may be generated using Bayesian estimation. The estimator may determine a number of test instances to be performed on the circuit design to identify the failure based on the maximum of the posterior probability distribution. For example, a user may define a budget for testing (e.g., 100 test instances). The estimator may indicate that a certain number (e.g., 80 test instances) may be sufficient to identify the failure. The test instances may be performed for constrained random verification (CRV).

CRV is a technique used in hardware design flows to improve the efficiency and effectiveness of validating design functionality. In CRV, a set of constraints may be defined to represent a desired behavior of a design under test (DUT). These constraints specify the ranges of valid inputs, expected output values, and other behaviors of the DUT being validated or verified. The desired functional behavior, design model, and constraints are defined in a hardware description language (HDL). Such a definition may be referred to herein as a testbench. An HDL simulator may compile the testbench into an executable simulation that generates random test cases that satisfy the intended verification behavior and constraints.

Certain aspects provide a procedural and enumerative approach (e.g., instead of the declarative and comprehensive approach) to exhaustive testing. The testbench includes coverage tracking primitives and the simulator provides coverage analysis tools that track the functional coverage of the testbench as a metric for the completeness of the verification performed by the set of random test cases generated by the testbench, helping the verification engineer to identify untested scenarios and improve the verification effort.

Advantages of the present disclosure include, but are not limited to, increased compute efficiency for performing failure testing. For example, by identifying the number of test instances that is sufficient to identify a failure, computer resources that would otherwise be used to perform excess tests may be saved. Thus, using Bayesian estimation, computing resources may be saved by accurately estimating the number of test instances to be performed.

Figure 1:
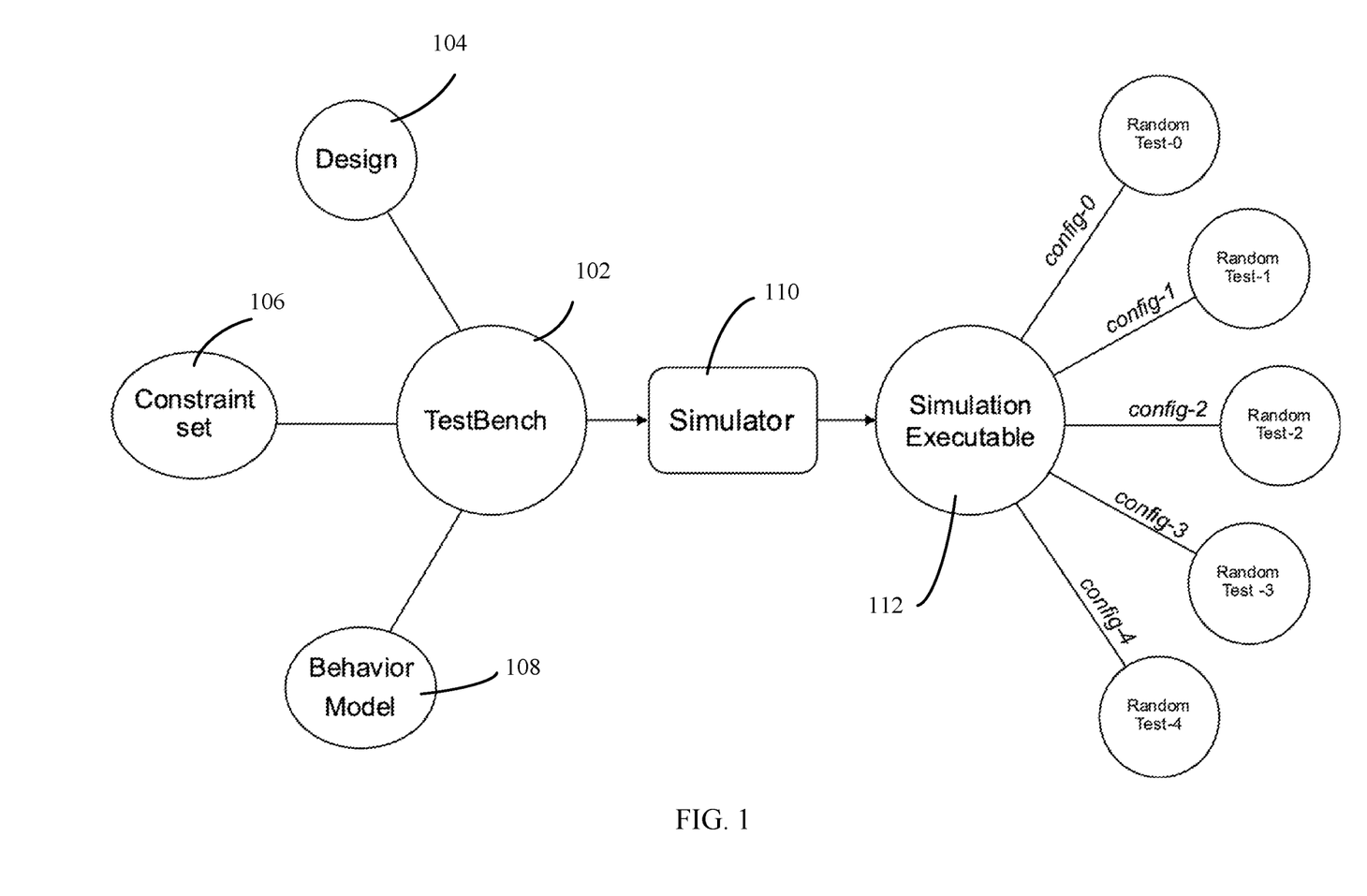
FIG. 1 illustrates an example testbench demonstrating how a small number of testbenches can generate many verification scenarios to evaluate or cover behaviors of interest.

FIG. 1 illustrates an example testbench 102 demonstrating how a small number of testbenches can generate many verification scenarios to evaluate or cover behaviors of interest. A testbench 102 may be implemented for a circuit design 104. The desired functional behavior 108 or design model and constraints 106 may be defined to implement the test bench. A single testbench 102 may have many options or command-line switches that control the behavior of the testbench model and the constraints, in addition to a control for the random sequence for each test instance generated. Each valuation of the command line switches is called a configuration. A simulation executable 112 run by a simulator 110 may be used to perform a series of random tests (e.g., random test-0 to random test-4) using different configurations (e.g., config-0 to config-4). The combination of the simulation executable and a unique configuration may be sufficient to distinguish any random test instance from other random test instances generated from testbenches.

The main benefits of CRV are the ability to test complex hardware designs efficiently, reduce testing time and cost, and improve design quality. However, CRV also involves an effort to develop correct constraints and testbench models. Another efficiency problem in CRV is that since there is no known systematic method to determine the number of random test cases to generate for achieving verification goals (e.g., how to reduce (minimize) the set of test cases from a testbench, also referred to herein as a minimum sufficient test-instance (MSTI) problem). When this problem includes bounds such as the maximum number of test instances that can be run or the maximum resources to run these test instances, the problem is referred to as the MSTI problem with bounds.

Certain aspects provide techniques to solve the MSTI problem with bounds efficiently. The MSTI problem with bounds may be solved using Bayesian estimation and machine learning by breaking the MSTI problem down into the two sub-problems (e.g., referred to herein as problems $P_1$ and $P_2$).

Problem $P_1$ involves determining how to use Bayesian estimation to estimate the minimum number of test instances that are to be run to detect all failures that would be detected if the maximum number of test instances within a given bound were generated and run. Problem $P_1$ may be converted into a sampling problem from an unknown distribution of passes and fails. Certain aspects use Bayesian estimation to solve the MSTI problem with bounds. The problem $P_2$ involves determining, given using Bayesian estimation to find a solution to the bounded MSTI problem, how to improve the quality of results of the estimator using machine learning.

Given some set of data drawn from an unknown distribution, a Bayesian model involves the specification of a probability distribution over parameters that are most likely, given the data. Thus, Bayesian methods model the likelihood of observed data. The modeled probability distribution can be thought of as the belief in a parameter (e.g., probability of failure) before any data has been observed and may be referred to as the prior distribution or a priori distribution. Bayes theorem may be then used to consider the influence of the observed data. A distribution over the parameters before the given data has been observed (the prior distribution) is then transformed into a probability distribution of the parameters after the data has been observed (e.g., referred to herein as the posterior distribution).

Problem P1 may be solved by first converting the MSTI problem into a Bayesian estimation problem with bounded sampling by abstracting out the random sequence control parameter—the random seed from each configuration $C_i$. Thus, the test instances may be assumed to be samples drawn from some unknown random distribution under a global assumption that the random seeds are drawn from some distribution or user-defined scheme that remains uniform through the estimation period.

Figure 2:
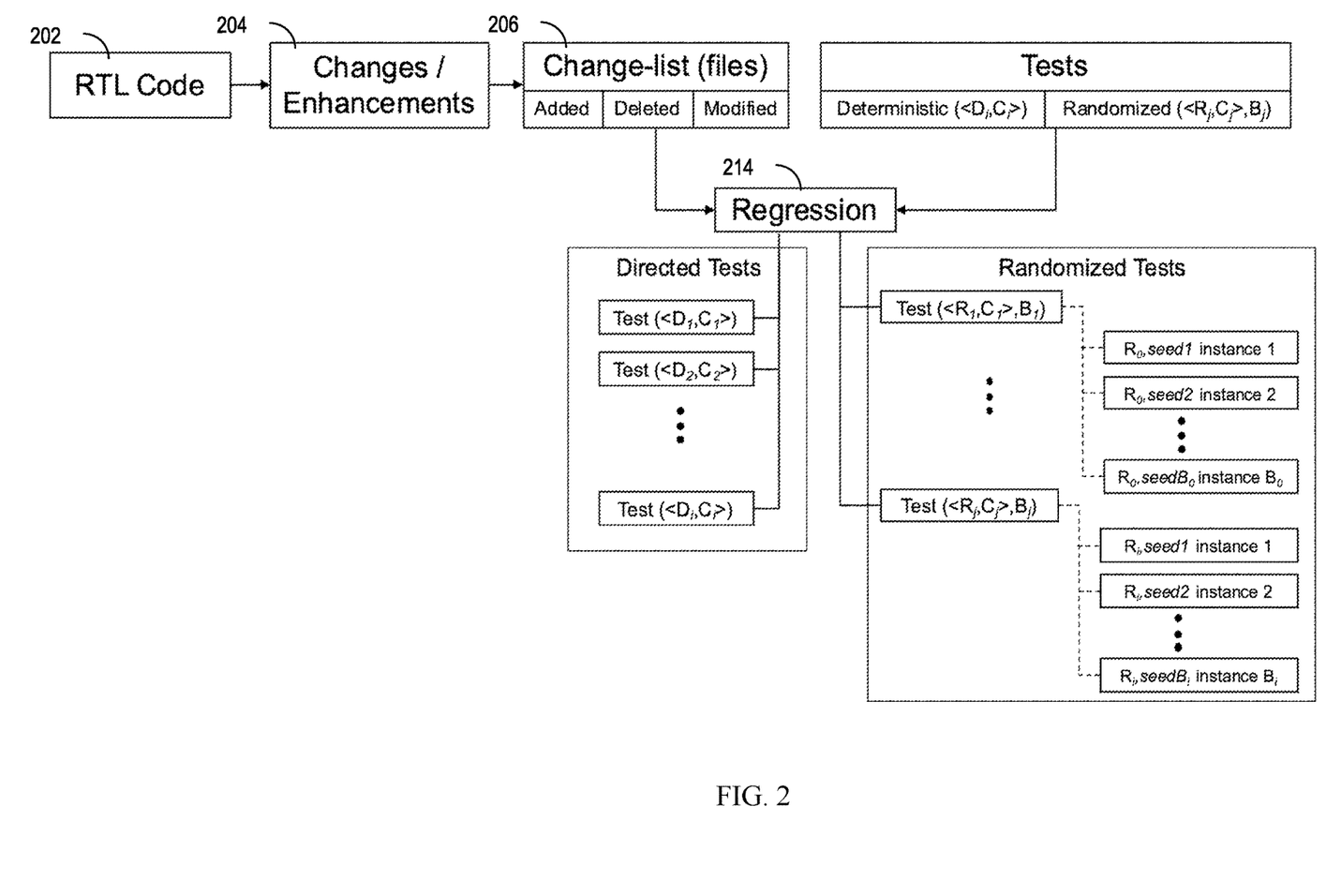
FIG. 2 illustrates a dataflow and test-configuration setup including random seed abstraction, in accordance with certain aspects of the present disclosure.

FIG. 2 illustrates a dataflow and test-configuration setup including random seed abstraction, in accordance with certain aspects of the present disclosure. Changes or enhancements 204 may be applied to RTL code 202, generating a change list 206 (e.g., files indicating additions, deletions, or modifications to the RTL code). Regressions 214 may be run on the change list 206 to validate the functional correctness of design changes in that change list. Regressions may include both deterministic tests, Di (e.g., directed tests), and randomized tests, $R_i$—each of which has a name and a configuration (set of switches and options to run the test). Each Randomized test $R_i$ has a pre-set budget $B_i$, which specifies the number of instances to be generated for the randomized test $R_i$.

In certain aspects, each instance generated for a randomized test $R_i$ may be distinguished from another instance by the random seed (e.g., seed 1 to seed $B_i$) used to initialize the internal random sequence generator. If the budget is not pre-specified for a randomized test $R_i$, the budget can be inferred using statistical measures such as the maximum or average of the number of instances generated for test $R_i$ seen in historical data from past regressions.

The MSTI problem as formulated corresponds to estimating over a sequence of Booleans (pass or fail) which in turn corresponds to estimating from a classical Bernoulli sampling distribution over the maximum number of allowed test-instance generations per testbench. This in turn allows for the creation of a closed-form Bayesian estimation formulation for the MSTI problem with bounds to estimate the number of generated test instances that will contain failures. Thus, certain aspects may indicate to a user how many times to generate test instances assuming a constant randomized test generation scheme.

Assuming a given prior probability distribution and a likelihood function for observed data, the posterior estimation can be obtained using Bayesian estimation. Bayes theorem provides expression:

$$P(\theta|y) = \frac{P(y|\theta)P(\theta)}{P(y)} \quad (1)$$

where, y is the sample data (e.g., data associated with the circuit failure) and $\theta$ is the unknown parameter that is being estimated. $P(\theta|y)$ is the data for the probability distribution for the unknown parameter (e.g., posterior). $P(y)$ is the independent probability of event y (e.g., independent probability of a failure). $P(y|\theta)$ is the likelihood probability of observing sample y (e.g., observing the failure) given $\theta$. $P(\theta)$ is prior probability of $\theta$, which represents a credibility assigned to parameter values before the data is analyzed. Thus, Bayesian estimation may be performed using the relation:

Posterior∝Likelihood*Prior  (2)

$P(\theta|y) \propto P(y|\theta)P(\theta)$  (3)

In eq. (2), likelihood is estimated using a Binomial distribution where each trial is a Bernoulli trial with success probability as $\theta$ in [0,1] based on expression:

$P(y|\theta) = \theta^y(1-\theta)^{n-y}$  (4)

The prior is created using Beta distribution in the interval [0,1] using a, b, for example, exponents of the random variable and shape of the distribution, per expression:

$\text{beta}(a,b) = \theta^a(1-\theta)^{b-1}$  (5)

Figure 3:
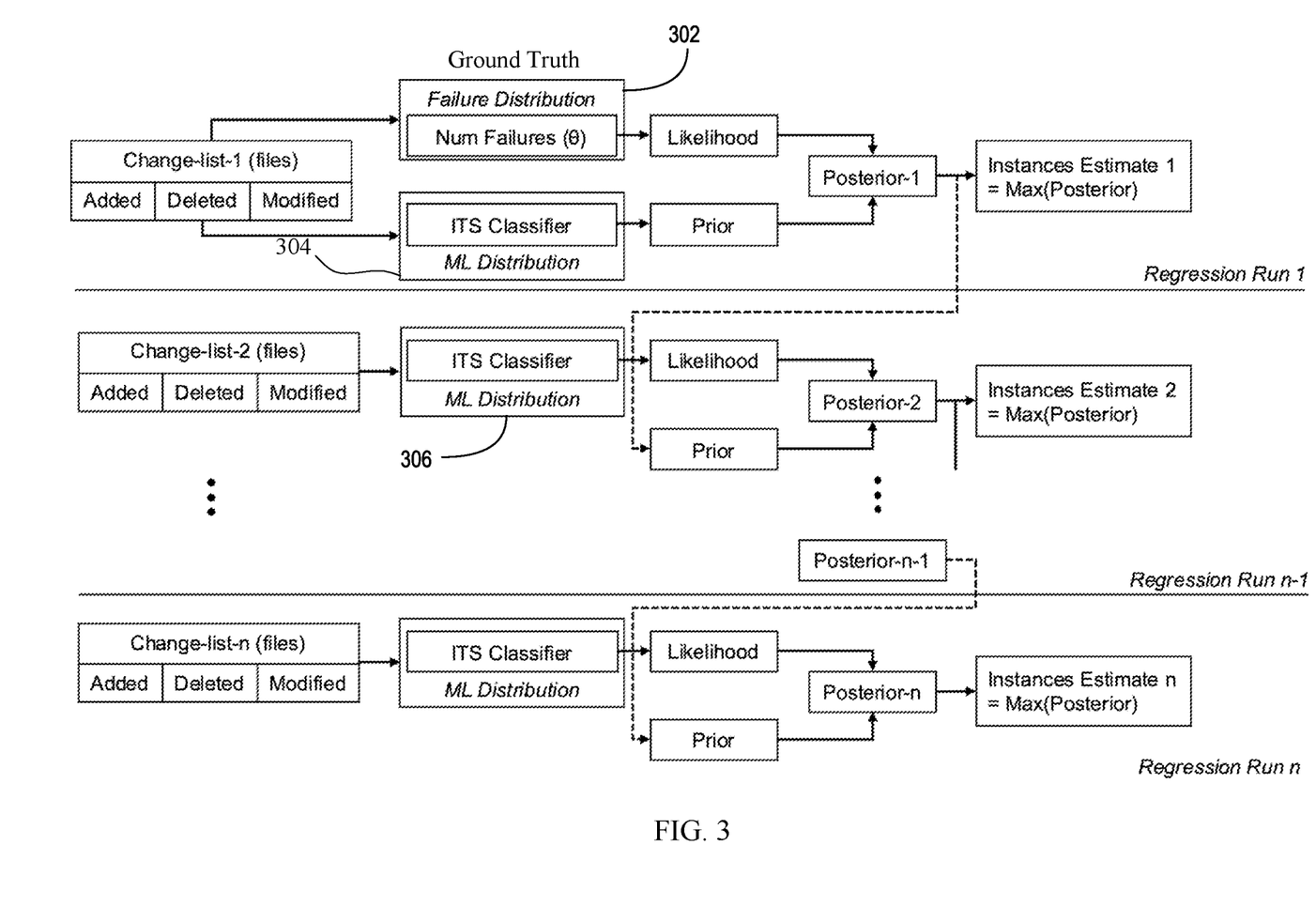
FIG. 3 illustrates example operations for iterative estimation of a randomized test instance count, in accordance with certain aspects of the present disclosure.

FIG. 3 illustrates example operations for iterative estimation of a randomized test instance count, in accordance with certain aspects of the present disclosure. The estimation of run count (e.g., number of test instances) for a random test across multiple change lists may be performed using a sequential process. Information from a past observation (e.g., for a previous change list) may be used for a present estimation (e.g., for a current change list). The posterior of the current measurement may be used as a prior for the next estimation, and so on. For example, for a first change list (labeled "change-list-1"), a failure distribution 302 (e.g., implemented with a Binomial distribution) may be determined as the likelihood and a Beta distribution 304 may be determined as the prior. In some cases, the failure distribution may be calculated using regression data (e.g., a ground truth). If the regression data is not available, machine learning (e.g., ITS classifier) may be used to determine the likelihood for Bayesian estimation, as described in more detail herein.

The likelihood and prior may be used to calculate a first posterior (labeled "Posterior-1"). The first instances estimate (labeled "Instances Estimate 1") may be calculated using a global maxima of Posterior-1, indicating a number of test instances to be performed for identifying a failure for change-list-1. That is, the first posterior may be a distribution of failure probability, and the instance estimate may be the maximum of the distribution. In some aspects, the posterior generated for change-list-1 may be used as a prior for a Bayesian estimation for a change-list-2. The likelihood for change-list-2 may be determined using machine learning, in some aspects. The same process may be performed for a sequence of change lists (e.g., change-list-1 to change-list-n, n being a positive integer).

The likelihood generated for Bayesian estimation is a decision rule used to estimate an unknown parameter $\theta$ that reduces (e.g., minimizes) the expected loss or accuracy loss for observations. The choice of the prior distribution is important to maintaining quality of results as the sequential estimation proceeds. If the prior distribution that is chosen is significantly different from the observed distribution, the estimation procedure suffers from problems with respect to numerical stability and quality of results.

If the prior and posterior distributions belong to the same probability distribution family, they are conjugate distributions. Conjugate priors are useful to reduce complexity and improve results. Thus, a beta distribution may be used as a good prior and binomial distribution as a likelihood. When a posterior is computed from the prior, the posterior forms a beta distribution and thus can be used as a prior for the next change list, as described herein. However, in practice, using a generic distribution like the beta distribution can introduce errors in the estimate since the actual prior distribution is neither stationary nor does it correspond exactly to a theoretical Beta distribution, as described with respect to problem P2.

To solve problem P2, a machine learning model may be trained on historical data for successive versions of a design and associated testbenches. The model may generate probabilities of whether a test instance will pass or fail. The machine learning model may be referred to herein as an intelligent test selection (ITS) classifier.

In some aspects, ITS predicted failure probability scores may be used to create the prior (e.g., referred to as an ML distribution or the beta distribution 304) if no prior is available. Ground truth (e.g., regression data) may be used to create the likelihood (e.g., binomial distribution). If ground truth is unavailable, ITS failure probability scores (e.g., from the ITS classifier) may be used to determine the likelihood. Posterior is computed from obtained prior and likelihood, and serves as prior for the next run (sequentially). The run count is estimated from the obtained posterior probability distribution.

As shown in FIG. 3, the first change list may use the ML classifier (ITS classifier) that generates test-instance failure probabilities to generate a prior for the first Bayesian estimation. The ML classifier may also generate the likelihood failure distributions (e.g., distribution 306) used in Bayesian estimation for subsequent change lists, as shown. For example, ITS classifier may generate the likelihood used to generate Posterior-2, where the prior is based on Posterior-1. The failure probabilities from the ML classifier correspond to a beta-binomial distribution over the test instance samples, which is a natural conjugate prior for the Bernoulli distribution that can be used to improve the accuracy of the estimate from the Bayesian estimator. Therefore, certain aspects of the present disclosure use the failure prediction probability distribution of the ML classifier (e.g., ITS classifier) to implement a Bayesian estimator from the distribution to predict the number of times to run a random test (e.g., or a termination point for randomizing the tests). Certain aspects create a likelihood from the historical data and a prior using the probability distribution to compute the posterior.

The posterior is used as a prior for the next change list, and likelihood is calculated based on the present ML classifier predictions. The computed prior (e.g., from posterior) and the likelihood are used to compute the posterior and estimate the index for the next change list. Certain aspects calculate a global maximum to find the termination for random tests from the current posterior distribution for the current regression. For example, once the posterior probability distribution is determined, the maximum of the posterior probability distribution may be used to indicate the number of test instances for the change list.

In some aspects, the estimator may receive, as input, a predicted instance count from a previous change list (e.g., to be used as the prior for estimation), predicted failure probability scores (e.g., to be used as the likelihood for estimation), and a targeted resource (e.g., user-defined) from a client configuration file.

The estimator may first compute the likelihood based on parameters D, C, and T. Parameter P may be the predicated failure probabilities. Parameter D may be the observed data (e.g., ground truth), as described herein. In some cases, if the ground truth is not available, the parameter D may be determined using the ITS classifier, as described (e.g., parameter D may be equal to a parameter P). Parameter C may be the maximum random test instance count (e.g., as specified by the user), and parameter T may be the tolerance for failure prediction accuracy. For example, the user may request 90% accuracy for a specific test. To calculate the likelihood, the estimator may calculate a parameter y based on expression:

$$y = \text{sorted(failed\_test\_index)}\left(\frac{T}{100}\text{len(failed\_tests\_index)} - 1\right)$$

where the failed_tests_index indicates the failed tests in observed data. Sorted(failed_tests_index) sorts the failed tests and len(failed_tests_index) provides the length of the failed_tests_index. The binomial distribution is calculated based on equation:

$$\theta^y(1-\theta)^{C-y}$$

where θ is a number of failures derived from the observed data (e.g., or generated using the ITS classifier).

The estimator may then compute the prior based on parameters P, C, and T. To calculate the prior, the alpha (a) parameter for the beta distribution is calculated per expression:

$$a = \text{sorted(failure\_prob\_index)}\left(\frac{T}{100}\text{lens(failure\_prob\_index)} - 1\right)$$

where failure_prob_index is prior probabilities of circuit failure. The beta (b) parameter for the beta distribution may be calculated per expression:

$$b = C - a$$

The estimator may then calculate the posterior based on the calculated likelihood and prior and predict the run count (e.g., number of test instances) using a maximum of the calculated posterior, as described herein.

Thus, a likelihood may be determined either using observed data (if available) or based on predicted failure probability. The likelihood may be calculated using a binomial distribution as described herein. For the binomial calculation, the parameter y may be calculated as described herein, which specifies number of times for an outcome to occur within n trials (e.g., number of test instances that may fail out of a total number of test instances based on the data observed or probability distribution). In order to compute the parameter y, the list or indexes of actual failed test instances may be identified from observed data (if available) or from predicted failure probability distribution. Based on a budget and list of failed instances, the number of test instances (e.g., parameter y) are identified that fit a defined budget as described herein. To find the actual index of test instances to compute likelihood, the list of failed index are sorted (e.g., using expression sorted(failure_prob_index)) and the corresponding actual $i^{th}$ test instance is identified, which may be used to calculate parameter y to form the binomial distribution.

Similarly, to form a beta distribution, alpha and beta parameters are calculated where the alpha parameter may be considered as the number of successes and the beta parameter may be mapped to the number of failures. Based on the predicted failure distribution, the list of failed test instances and associated indexes are identified. Based on the defined budget and list of total failed test instances obtained, the number of successes (e.g., a count value) are computed. Based on the count value, the index or $i^{th}$ test instance (from the sequence) the can be consider as a final number of successes (e.g., alpha for a test having total C test instances) may be identified. Further the number of successes (alpha) are subtracted from C (total) to obtain the beta parameter (e.g., failures). The alpha and beta parameters are used to form a beta distribution, as described herein.

In some aspects, a user may configure the estimator to consume a predicted instance count without any modification (e.g., a current test instance count may be equal to a previously predicted run count). A user may obtain the instance count value based on a certain accuracy in some aspects. For example, the user may perform multiple iterations to get an instance count value based on different input accuracies within [1, 100]. That is, the test instance count (test_instance_count) for a current change list n may be calculated based on expression:

$$\text{test\_instance\_count}(n) = F(\text{predict\_run\_count}_i(n-1))$$

where i is the input accuracy [1, 100]. In other words, the test instance count for change list n may be a function of the predicted run count (predict_run_count) for a previous change list and for a specific input accuracy i.

In some aspects, a user may have a fixed set of resources, and based on these limited resources, the estimator may suggest an instance count value (e.g., that consumes less than or equal to the resource limit) and maximum accuracy that can be achieved. Test instance count may be calculated based on expression:

$$\text{test\_instance\_count}(n) = \text{predict\_run\_count}_i(n-1) \geq \text{Resource limit}$$

where i is the maximum accuracy that can be achieved.

In some aspects, a user may decide to accept or reject the instance count value predicted by estimator. In case of rejection, the client may configure the following estimation run with user-defined values.

In some aspects, ITS may be used to generate failure probabilities for tests in a regression. The estimator may use the ITS predicted failure probability scores to create a prior for a random test. The estimator may then use the same historical data used by ITS for the same random test to generate a likelihood. Based on the prior and likelihood, the estimator estimates the posterior to achieve a defined targeted accuracy.

Figure 4:
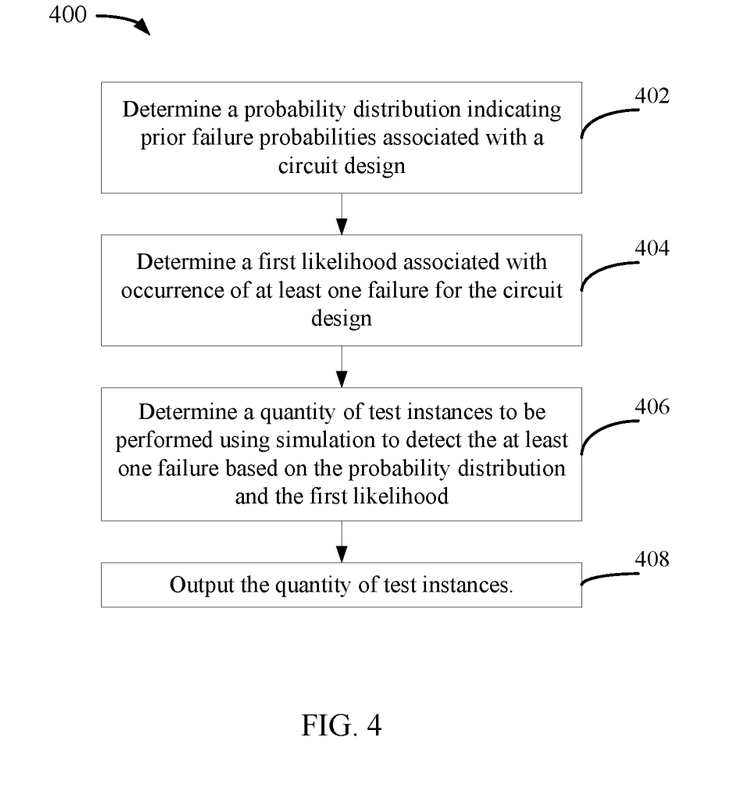
FIG. 4 is a flow diagram illustrating example operations for circuit testing, in accordance with certain aspects of the present disclosure.

FIG. 4 is a flow diagram illustrating example operations 400 for circuit testing, in accordance with certain aspects of the present disclosure. The operations 400 may be performed by an estimator, such as the estimator 627 of FIG. 6.

At block 402, the estimator determines a probability distribution indicating prior failure probabilities associated with a circuit design. In some aspects, the probability distribution is determined via a machine learning model (e.g., ITS classifier 629 of FIG. 6). In some aspects, the probability distribution may include a beta distribution.

At block 404, the estimator determines a first likelihood associated with occurrence of at least one failure for the circuit design. In some aspects, determining the first likelihood may include estimating the first likelihood using a Binomial distribution.

In certain aspects, the first likelihood associated with occurrence of the at least one failure may be determined based on test data (e.g., ground truth) collected for the at least one failure. In some cases, the first likelihood associated with occurrence of the at least one failure may be determined via a machine learning model (e.g., if the ground truth is not available), such as the ITS classifier 629.

At block 406, the estimator determines a quantity of test instances (e.g., run count) to be performed using simulation to detect the at least one failure based on the probability distribution and the first likelihood. The quantity of test instances may be determined based on the probability distribution and the first likelihood using Bayesian estimation. Each of the test instances may include a constrained random simulation (CRS) test. Each of the test instances may include a randomized test based on a random test seed value.

At block 408, the estimator outputs the quantity of test instances. In some aspects, the estimator may determine a posterior probability distribution based on the probability distribution and the first likelihood using Bayesian estimation. The quantity of test instances may be determined based on the posterior probability distribution. For example, the quantity of test instances may be determined based on a maximum of the posterior probability distribution.

In some aspects, the posterior probability distribution may be determined for a first change (e.g., change-list-1 shown in FIG. 3) to the circuit design. The estimator may determine a second likelihood for a second change (e.g. change-list-2) to the circuit design. The estimator may determine a quantity of test instances to be performed using simulation to detect the at least one failure for the second change based on the second likelihood and the posterior probability distribution. The second likelihood may be determined using a machine learning model (e.g., ITS classifier), in some aspects.

Figure 5:
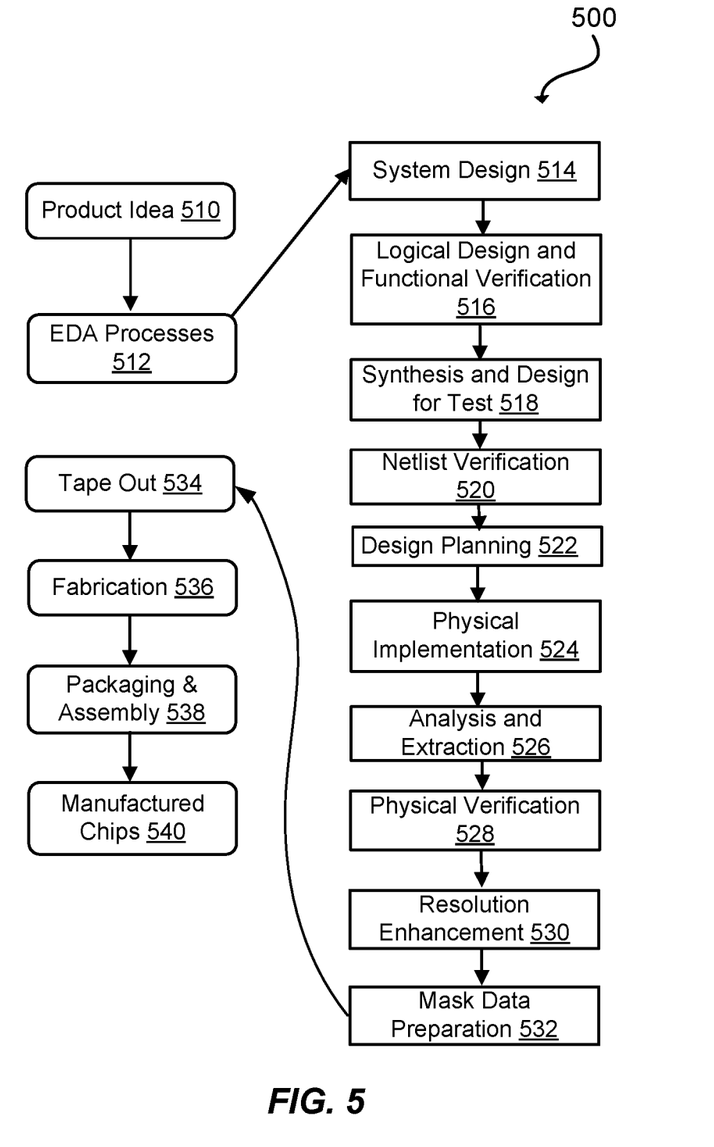
FIG. 5 illustrates an example set of processes used during the design, verification, and fabrication of an article of manufacture such as an integrated circuit to transform and verify design data and instructions that represent the integrated circuit.

FIG. 5 illustrates an example set of processes 500 used during the design, verification, and fabrication of an article of manufacture such as an integrated circuit to transform and verify design data and instructions that represent the integrated circuit. Each of these processes can be structured and enabled as multiple modules or operations. The term 'EDA' signifies the term 'Electronic Design Automation.' These processes start with the creation of a product idea 510 with information supplied by a designer, information which is transformed to create an article of manufacture that uses a set of EDA processes 512. When the design is finalized, the design is taped-out 534, which is when artwork (e.g., geometric patterns) for the integrated circuit is sent to a fabrication facility to manufacture the mask set, which is then used to manufacture the integrated circuit. After tape-out, a semiconductor die is fabricated 536 and packaging and assembly processes 538 are performed to produce the finished integrated circuit 540.

Specifications for a circuit or electronic structure may range from low-level transistor material layouts to high-level description languages. A high-level representation may be used to design circuits and systems, using a hardware description language ('HDL') such as VHDL, Verilog, SystemVerilog, SystemC, MyHDL or OpenVera. The HDL description can be transformed to a logic-level register transfer level ('RTL') description, a gate-level description, a layout-level description, or a mask-level description. Each lower representation level that is a more detailed description adds more useful detail into the design description, for example, more details for the modules that include the description. The lower levels of representation that are more detailed descriptions can be generated by a computer, derived from a design library, or created by another design automation process. An example of a specification language at a lower level of representation language for specifying more detailed descriptions is SPICE, which is used for detailed descriptions of circuits with many analog components. Descriptions at each level of representation are enabled for use by the corresponding tools of that layer (e.g., a formal verification tool). A design process may use a sequence depicted in FIG. 5. The processes described by be enabled by EDA products (or tools).

During system design 514, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 516, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some embodiments, special systems of components referred to as 'emulators' or 'prototyping systems' are used to speed up the functional verification.

During synthesis and design for test 518, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 520, the netlist is checked for compliance with timing constraints and for correspondence with the HDL code. During design planning 522, an overall floor plan for the integrated circuit is constructed and analyzed for timing and top-level routing.

During layout or physical implementation 524, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flipflop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 526, the circuit function is verified at the layout level, which permits refinement of the layout design. During physical verification 528, the layout design is checked to ensure that manufacturing constraints are correct, such as DRC constraints, electrical constraints, lithographic constraints, and that circuitry function matches the HDL design specification. During resolution enhancement 530, the geometry of the layout is transformed to improve how the circuit design is manufactured.

During tape-out, data is created to be used (after lithographic enhancements are applied if appropriate) for production of lithography masks. During mask data preparation 532, the 'tape-out' data is used to produce lithography masks that are used to produce finished integrated circuits.

A storage subsystem of a computer system (such as computer system 600 of FIG. 6) may be used to store the programs and data structures that are used by some or all of the EDA products described herein, and products used for development of cells for the library and for physical and logical design that use the library.

Figure 6:
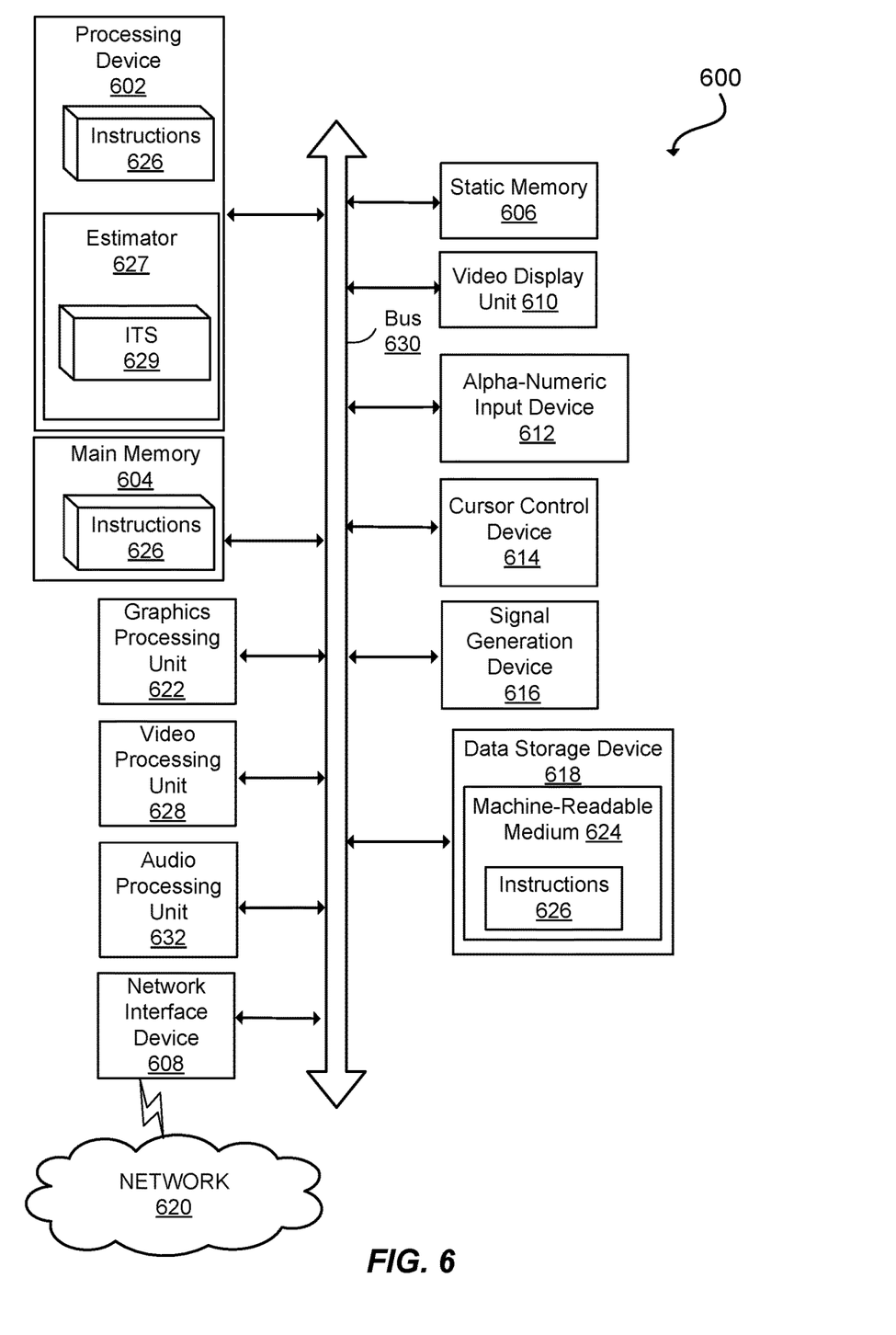
FIG. 6 illustrates an example machine of a computer system within which a set of instructions, for causing the machine to perform any one or more of the methodologies discussed herein, may be executed.

FIG. 6 illustrates an example machine of a computer system 600 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM), a static memory 606 (e.g., flash memory, static random access memory (SRAM), etc.), and a data storage device 618, which communicate with each other via a bus 630.

Processing device 602 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 may also be one or more special-purpose processing devices such as an application specific integrated circuit (ASIC), a field programmable gate array (FPGA), a digital signal processor (DSP), network processor, or the like. The processing device 602 may be configured to execute instructions 626 for performing the operations and steps described herein.

The computer system 600 may further include a network interface device 608 to communicate over the network 620. The computer system 600 also may include a video display unit 610 (e.g., a liquid crystal display (LCD) or a cathode ray tube (CRT)), an alphanumeric input device 612 (e.g., a keyboard), a cursor control device 614 (e.g., a mouse), a graphics processing unit 622, a signal generation device 616 (e.g., a speaker), graphics processing unit 622, video processing unit 628, and audio processing unit 632.

The data storage device 618 may include a machine-readable storage medium 624 (also known as a non-transitory computer-readable medium) on which is stored one or more sets of instructions 626 or software embodying any one or more of the methodologies or functions described herein. The instructions 626 may also reside, completely or at least partially, within the main memory 604 and/or within the processing device 602 during execution thereof by the computer system 600, the main memory 604 and the processing device 602 also constituting machine-readable storage media.

In some implementations, the instructions 626 include instructions to implement functionality corresponding to the present disclosure. While the machine-readable storage medium 624 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 602 to perform any one or more of the methodologies of the present disclosure. The term "machine-readable storage medium" shall accordingly be taken to include, but not be limited to, solid-state memories, optical media, and magnetic media.

In some aspects of the present disclosure, the processing device 602 may include an estimator 627, which may be configured to determine a quantity of test instances using Bayesian estimation, as described herein. The estimator 627 may include an ITS classifier 629, in some cases.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A method for coverage analysis, comprising:
   determining a probability distribution indicating prior failure probabilities associated with a circuit design;
   determining a first likelihood associated with occurrence of at least one failure for the circuit design;
   determining, by a processing device, a quantity of test instances to be performed using simulation to detect the at least one failure based on the probability distribution and the first likelihood; and
   outputting the quantity of test instances.

2. The method of claim 1, wherein the probability distribution is determined via a machine learning model.

3. The method of claim 1, wherein determining the first likelihood comprises estimating the first likelihood using a Binomial distribution.

4. The method of claim 1, wherein the quantity of test instances is determined based on the probability distribution and the first likelihood using Bayesian estimation.

5. The method of claim 1, wherein the probability distribution comprises a beta distribution.

6. The method of claim 1, wherein the first likelihood associated with occurrence of the at least one failure is determined based on test data collected for the at least one failure.

7. The method of claim 1, wherein the first likelihood associated with occurrence of the at least one failure is determined via a machine learning model.

8. The method of claim 1, further comprising determining a posterior probability distribution based on the probability distribution and the first likelihood using Bayesian estimation, wherein the quantity of test instances is determined based on the posterior probability distribution.

9. The method of claim 8, wherein the quantity of test instances is determined based on a maximum of the posterior probability distribution.

10. The method of claim 8, wherein:
    the posterior probability distribution is determined for a first change to the circuit design; and
    the method further comprises:
       determining a second likelihood for a second change to the circuit design; and
       determining a quantity of test instances to be performed using simulation to detect the at least one failure for the second change based on the second likelihood and the posterior probability distribution.

11. The method of claim 10, wherein the second likelihood is determined using a machine learning model.

12. The method of claim 1, wherein each of the test instances comprises a constrained random simulation (CRS) test.

13. The method of claim 1, wherein each of the test instances comprises a randomized test based on a random test seed value.

14. An apparatus for coverage analysis, comprising:
    a memory; and
    one or more processors coupled to the memory and configured to:
       determine a probability distribution indicating prior failure probabilities associated with a circuit design;
       determine a first likelihood associated with occurrence of at least one failure for the circuit design;
       determine a quantity of test instances to be performed using simulation to detect the at least one failure based on the probability distribution and the first likelihood; and
       output the quantity of test instances.

15. The apparatus of claim 14, wherein the probability distribution is determined via a machine learning model.

16. The apparatus of claim 14, wherein, to determine the first likelihood, the one or more processors are configured to estimate the first likelihood using a Binomial distribution.

17. The apparatus of claim 14, wherein the one or more processors are configured to determine the quantity of test instances based on the probability distribution and the first likelihood using Bayesian estimation.

18. The apparatus of claim 14, wherein the probability distribution comprises a beta distribution.

19. The apparatus of claim 14, wherein the one or more processors are configured to determine the first likelihood associated with occurrence of the at least one failure based on test data collected for the at least one failure.

20. A non-transitory computer-readable medium having instructions stored thereon, that when executed by one or more processors, cause the one or more processors to:
  determining a probability distribution indicating prior failure probabilities associated with a circuit design;
  determining a likelihood associated with occurrence of at least one failure for the circuit design;
  determining a number of test instances to be performed using simulation to detect the at least one failure based on the probability distribution and the likelihood; and
  outputting the number of test instances.

* * * * *